United States Patent
Kerszykowski et al.

(10) Patent No.: US 7,031,183 B2
(45) Date of Patent: Apr. 18, 2006

(54) MRAM DEVICE INTEGRATED WITH OTHER TYPES OF CIRCUITRY

(75) Inventors: Gloria J. Kerszykowski, Fountain Hills, AZ (US); Li Hsin Chang, Chandler, AZ (US); Mark A. Durlam, Chandler, AZ (US); Mitchell T. Lien, Gilbert, AZ (US); Thomas V. Meixner, Gilbert, AZ (US); Loren J. Wise, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 24 days.

(21) Appl. No.: 10/730,239

(22) Filed: Dec. 8, 2003

(65) Prior Publication Data

US 2005/0122772 A1   Jun. 9, 2005

(51) Int. Cl.
*G11C 7/00* (2006.01)
(52) U.S. Cl. ........................... 365/158; 365/161
(58) Field of Classification Search ............... 365/158, 365/161; 257/30, 295, 421
See application file for complete search history.

(56) References Cited

U.S. PATENT DOCUMENTS

| | | | |
|---|---|---|---|
| 5,940,319 A | 8/1999 | Durlam | |
| 6,055,178 A | 4/2000 | Naji | |
| 6,153,443 A | 11/2000 | Durlam | |
| 6,165,803 A | 12/2000 | Chen | |
| 6,174,737 B1 | 1/2001 | Durlam | |
| 6,233,172 B1 | 5/2001 | Chen | |
| 6,292,389 B1 | 9/2001 | Chen | |
| 6,376,260 B1 | 4/2002 | Chen | |
| 6,518,071 B1 | 2/2003 | Durlam | |
| 6,552,927 B1 | 4/2003 | Naji | |
| 6,842,361 B1 * | 1/2005 | Miyatke et al. | 365/145 |
| 6,861,715 B1 * | 3/2005 | Zhang | 257/390 |
| 6,903,963 B1 * | 6/2005 | Hidaka | 365/158 |
| 2003/0156449 A1 * | 8/2003 | Ooishi | 365/171 |

\* cited by examiner

*Primary Examiner*—Vu A. Le
(74) *Attorney, Agent, or Firm*—James L. Clingan, Jr.

(57) ABSTRACT

A magnetoresistive random access memory (MRAM) is embedded with another circuit type. Logic, such as a processing unit, is particularly well-suited circuit type for embedding with MRAM. The embedding is made more efficient by using a metal layer that is used as part of the interconnect for the other circuit also as part of the MRAM cell. The MRAM cells are all written by program lines, which are the two lines that cross to define a cell to be written. Thus, the design is simplified because there is commonality of usage of the metal line that is used for one of the program lines for the MRAM and for one of the interconnect lines for the logic.

19 Claims, 5 Drawing Sheets

US 7,031,183 B2

MRAM DEVICE INTEGRATED WITH OTHER TYPES OF CIRCUITRY

FIELD OF THE INVENTION

This invention relates to magnetoresistive random access memories (MRAMs), and more particularly, to integrated circuits that have both MRAM and another circuitry type.

RELATED ART

Magnetoresistive random access memories (MRAMs) have the benefit of being non-volatile while also having some of the valuable characteristics of regular random access memories (RAMs) such as DRAMS and SRAMs. Accordingly, MRAMs are attractive not only as stand alone memories but also embedded on the same integrated circuit as other circuits. Since MRAM cells are made using different materials and processes than other those used for non-MRAM circuits, the MRAM cells are planned for formation after all of the other processes have been completed.

Another issue that is always present is cost. The cost of MRAM processing is added to the cost of making the other circuitry. This extra cost can reduce the attractiveness of MRAM as an embedded memory. Thus there is a need to provide embedded MRAM at reduced cost.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect a magnetoresistive random access memory (MRAM) is embedded with another circuit type. Logic, such as a processing unit, is particularly well-suited circuit type for embedding with MRAM. The embedding is made more efficient by using a metal layer that is used as part of the interconnect for the other circuit also as part of the MRAM cell. The MRAM cells are all written by program lines. In this usage, a program line is one of either of the two lines that write the cell that is located at the crossing of the two program lines. The design is simplified because there is commonality of usage of the metal line that is used for one of the program lines for the MRAM and for one of the interconnect lines for the logic. This is better understood by reference to the drawings and the following description.

Figure 1:
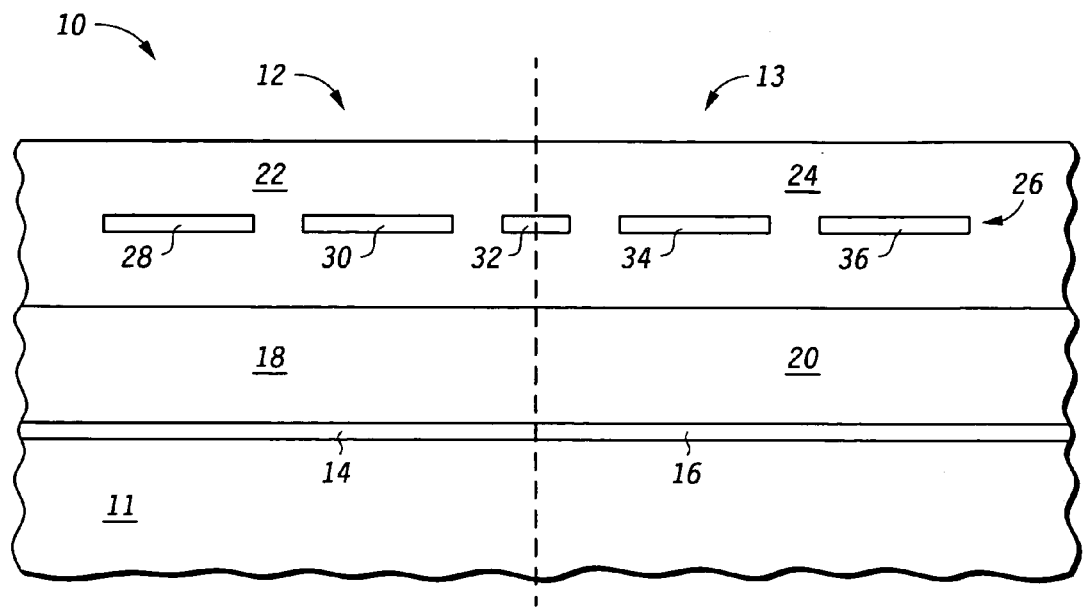
FIG. 1 is a cross section of a portion of an integrated circuit having an embedded MRAM and another circuit according to one aspect of the invention.

Shown in FIG. 1 is a semiconductor device 10 comprising a semiconductor substrate 11, a logic portion 12, and an MRAM portion 13. Logic portion 12 comprises a front end 14, a gate and interconnect region 18 over front end 14, and an interconnect region 22. MRAM portion 13 comprises a front end 16, an interconnect region 20 over front end 16, and an interconnect region 24. Interconnect region 24 is the region where MRAM cells are formed. These MRAM cells are not shown in FIG. 1. Both interconnect regions 22 and 24 have present therein a metal layer 26 as shown in FIG. 1, which is useful for interconnect in regions 22 and 24, and in particular is used as a programming line in region 24. Metal layer 26 comprises metal portions 28, 30, 32, 34, and 36. Metal portions 28 and 30 are wholly in logic portion 12. Metal portions 34 and 36 are wholly in MRAM region 13. Metal portion 32 extends into both MRAM portion 13 and logic portion 12. Metal layer 26 is made by a deposition of a continuous layer of metal that is then patterned to leave metal portions. A metal layer, as used herein, is a plurality of metal portions that are substantially the same distance above the substrate. Front end, as used herein, is the region where the transistors are formed which typically means the top portion of the substrate where sources and drains are formed and the gates that are formed above the substrate. Thus, front ends 14 and 16 are formed both in and above substrate 11. Interconnect regions 18 and 20 are formed of conductive layers, which have dielectric layers separating them, useful in making electrical connections, such as electrical connections between transistors.

In operation, semiconductor device 10 has an MRAM and another circuit that operate together. The other circuit is preferably a logic circuit such as a processor but may be any non-MRAM circuit such as an RF circuit. The logic circuit is formed in portion 12. The MRAM is formed in portion 13. Both the MRAM and the logic circuit use the metal line 26. Preferably, metal line 26 is used as a program line in MRAM 24.

Figure 2:
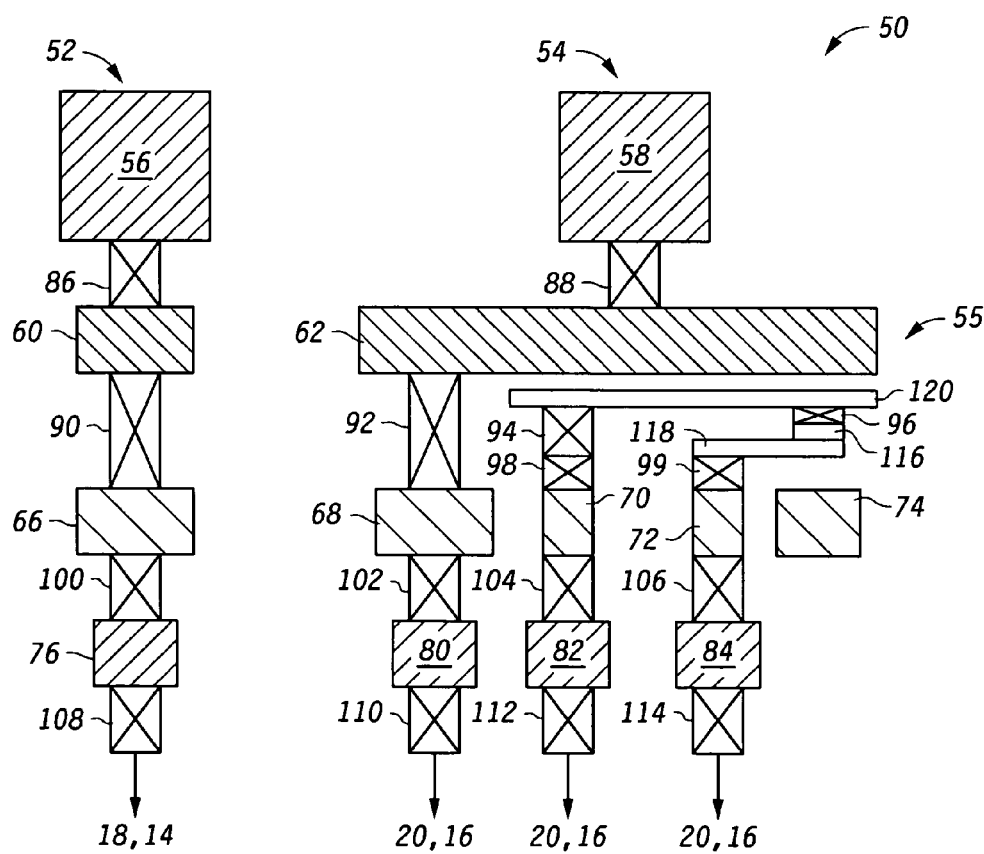
FIG. 2 is a cross section of an integrated circuit according to one implementation of the integrated circuit of FIG. 1.

Shown in FIG. 2 is a semiconductor device 50 showing a first more detailed implementation of the device of FIG. 1. Device 50 comprises an interconnect 52 as a first detailed implementation of interconnect 22 of FIG. 1 and interconnect 54 as a first detailed implementation of interconnect 24 of FIG. 1. Interconnect 52 comprises metal portions 56, 60, 66, and 76 connected by vias 86, 90, and 100, respectively. Also present in interconnect 52 is via 108 which is for connecting metal portion 76 to one of interconnect 18 and front end 14. Interconnect 52 functions to provide interconnect for the logic circuit formed in portion 12. Interconnect 54 comprises metal portions 58, 62, 68, 70, 72, 74, 80, 82, and 84, vias 88, 92, 94, 96, 98, 99, 102, 104, 106, 110, 112, 114, a cell interconnect 120, a magnetic tunnel junction (MTJ) 116, and a sense connection 118. Vias 88, 92, and 102 interconnect metal portions 58, 62, 68, and 80, respectively. Vias 94 and 98 are stacked on top of each other and connect cell interconnect 120 and metal portion 70. Via 104 connects metal portion 70 and metal portion 82. Vias 110, 112, and 114 have one end connected to metal portions 80, 82, and 84, respectively. The other end is connected to either front end 16 or interconnect 20. Via 96 connects cell interconnect 120 to MTJ 116. Sense connection 118 connects MTJ 116 to via 99. Metal portion 74 runs in a direction orthogonal to metal portion 62. Via 99 connects sense connection 118 to metal portion 72. Vias 102, 104, and 106 connect metal portions 68, 70, and 72 to metal portions 80, 82, and 84, respectively.

Metal portions 80, 82, and 84 are not essential to the formation of the memory cell.

Metal portion 74 and metal portion 62 are for writing the state of MTJ 116, each of which is a program line. Metal portion 74 is a digit line and metal portion 62 is a bit line. The arrangement of metal portions 62, 68, 70, 72, and 74, vias 92, 94, 96, 98, 99, sense connection 118, cell interconnect 120, and MTJ 116 are known to one of ordinary skill in the art to form an MRAM cell 55. Metal portions 60 and 62 comprise a metal layer. Similarly, metal portions 66, 68, 70, 72, and 74 form a metal layer. Thus, in this implementation shown in FIG. 2, two metal lines are in common between interconnects 52 and 54. Both of these metal lines are used as program lines by the MRAM cell in interconnect 54. Metal portions 74 and 62, and therefore metal portions 60 and 66, are separated by the distance needed to form an MRAM cell.

In this case shown in FIG. 2 then, vias 90 and 92 then span this same distance. This distance in this example can be about 4000 Angstroms. The metal portions 60 and 66 are connected in many locations by vias such as via 90. With these many via connections, these two metal portions are in effect a highly conductive single layer even though they are from different metal layers. It is sometimes desirable for the top two metal layers to be highly conductive to be effective for carrying relatively high currents. In this example, each metal portion 60 and 66 may be less than is desirable for that function but for the combination of the two plus via 90, the effect is the desired result. In such a case the mask pattern for the metal portion 60 and 66 can be the same. Metal portion 76 would normally be last of the relatively thin metal layers and would be, for example, about 3250 Angstroms whereas metal portion may be, for example, 8400 Angstroms. Metal portions 60 and 66 may be 5150 and 3250 Angstroms, respectively, which adds to the 8400 Angstroms desired for the top two layers. This could be viewed as separating the next to last layer into to two layers, which are substantially coterminous over logic front end 14, and putting the MRAM cells between those two layers and using these two layers as the programming lines over MRAM front end 16. This does increase the total height but not by as much as would be if the MRAM was added after formation of metal portions. Another benefit is that an MRAM can be added to an existing logic design with the only modification to the logic side by splitting the first (closest to the substrate) of the thick metal layers and connecting the two pieces by vias. Splitting the last metal is also feasible but is less attractive than the next to last metal because planarity becomes less at the further distance from the substrate, which makes making the MRAM cell more difficult. The result is that the metal layers for both program portions 62 and 74 are in common with the logic portion 12 and the MRAM portion 13.

Figure 3:
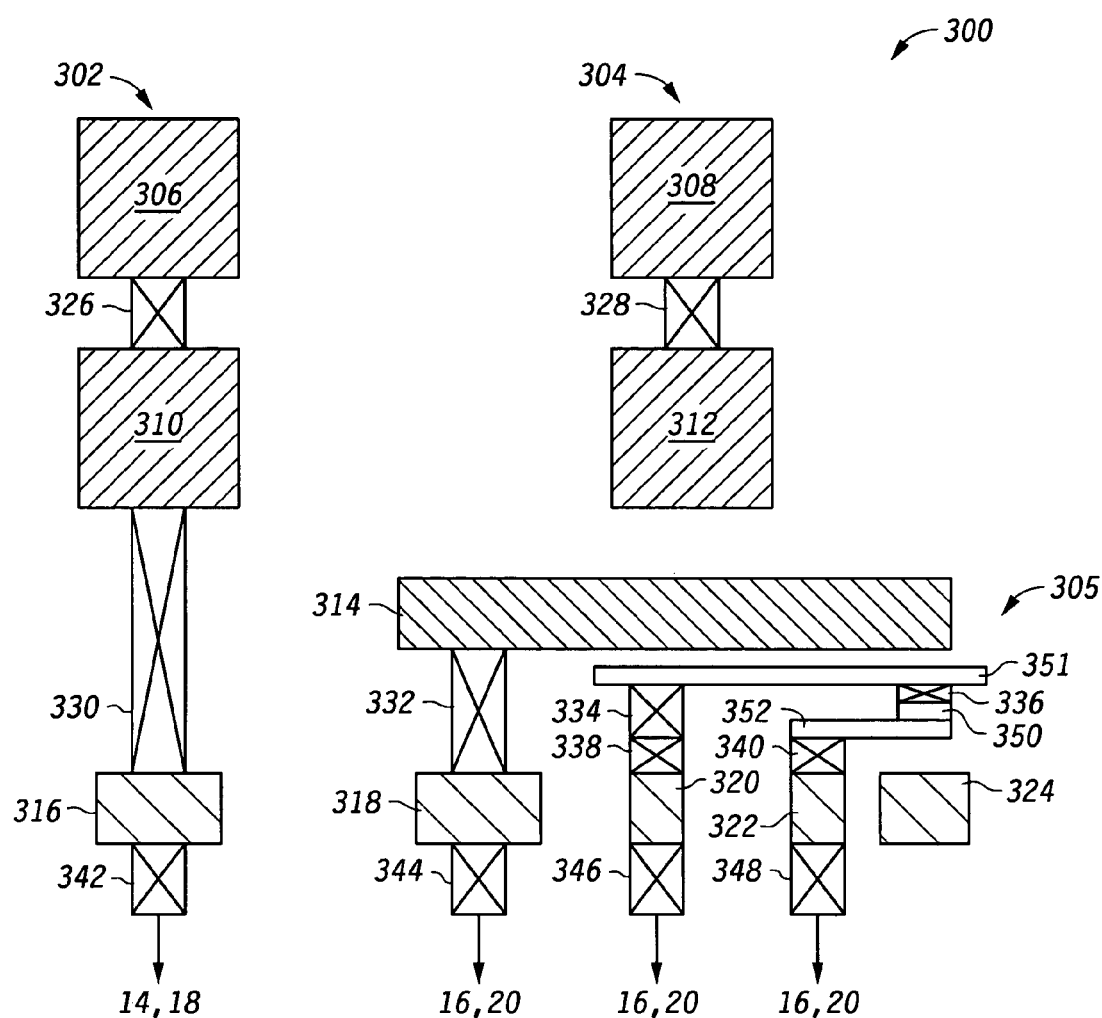
FIG. 3 is a cross section of an integrated circuit according to a second implementation of the integrated circuit of FIG. 1.

Shown in FIG. 3 is a semiconductor device 300 showing a second more detailed implementation of the device of FIG. 1. Device 300 comprises an interconnect 302 as a second detailed implementation of interconnect 22 of FIG. 1 and interconnect 304 as a second detailed implementation of interconnect 24 of FIG. 1. Interconnect 302 comprises metal portions 306, 310, and 316 connected respectively by vias 326 and 330. Via 342 connects metal portion 316 to either interconnect 14 or front end 18. Interconnect 304 comprises metal portions 308, 312, 314, and 318, vias 328, 332, 334, 336, 338, 340, 344, 346, and 348, MTJ 350, cell interconnect 351, and sense connection 352. Via 328 connects metal portions 308 and 312. Except for metal portions 308 and 312 and via 328, the elements identified in FIG. 3 for interconnect 304 have analogous elements connected in the same way as in FIG. 2 to form an MRAM cell 305 as is known to one of ordinary skill in the art. Metal portions 316, 318, 320, and 322 form a metal layer so that MRAM cell 305 uses the same metal line for a digit line as interconnect 302 does for making a connection in performing its function of being an interconnect. In this case the bit line, metal portion 314, is formed below metal portion 312. Portions 310 and 312 form the first thick metal layer. Thus, MRAM cell 305 uses the space between the last of the thin metal layers and the first of the thick metal layers while using the last of the thin metal layers for a program line. This is particularly advantageous in requiring minimal changes in the existing logic design, only requiring a longer via.

Figure 4:
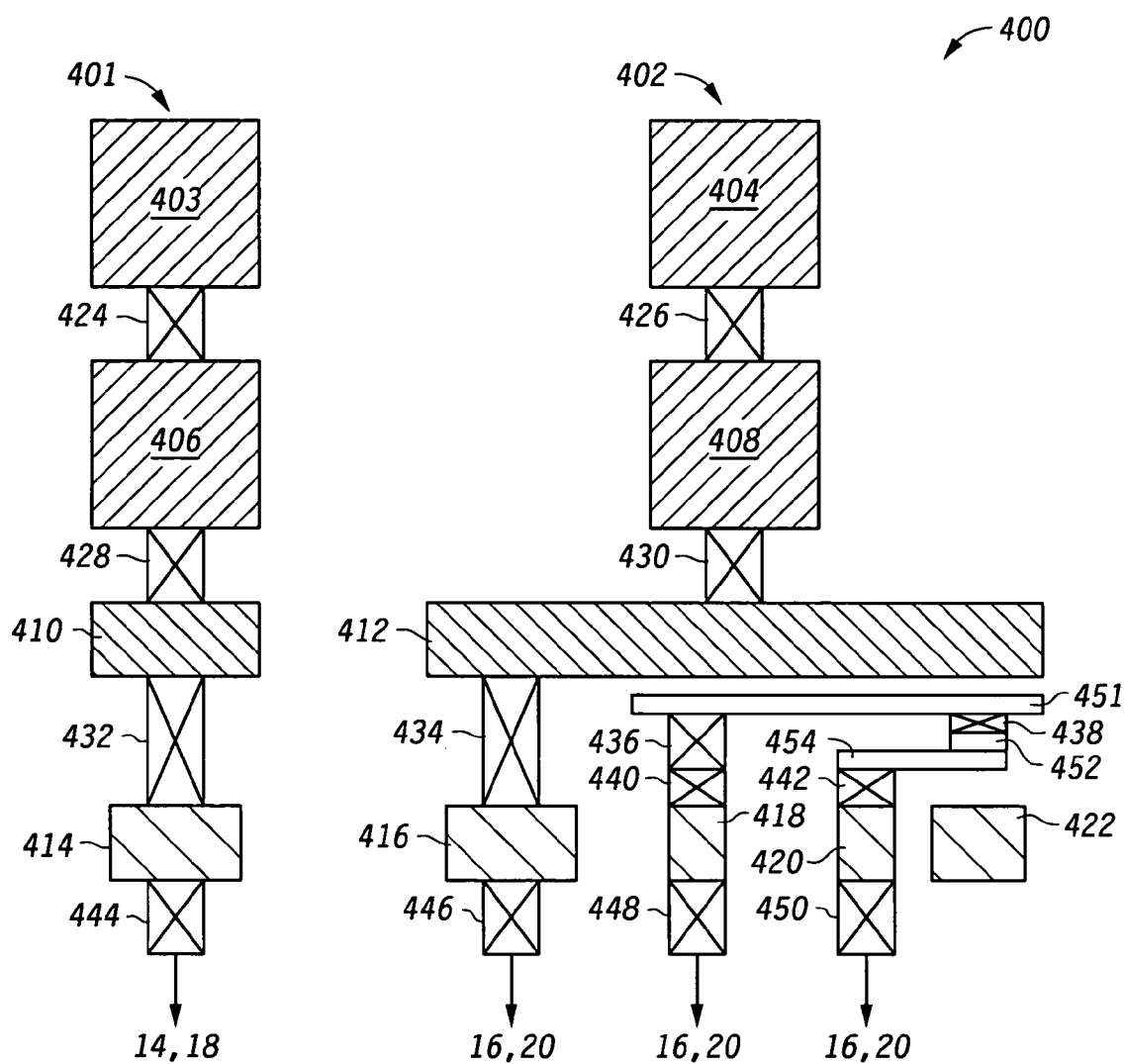
FIG. 4 is a cross section of an integrated circuit according to a third implementation of the integrated circuit of FIG. 1.

Shown in FIG. 4 is a semiconductor device 400 showing a third more detailed implementation of the device of FIG. 1. Device 400 comprises an interconnect 401 as a third detailed implementation of interconnect 22 of FIG. 1 and interconnect 402 as a third detailed implementation of interconnect 24 of FIG. 1. Interconnect 401 comprises metal portions 403, 406, 410, and 414 and vias 424, 428, 432, and 444. Vias 424, 428, and 432 interconnect metal portions 403, 406, 410, and 414, respectively. Interconnect 401 is the same as interconnect 302 of FIG. 3 except for the insertion of metal portion between the first thick metal layer 406 and the last thin metal layer 410 to make to short vias 428 and 432 in place of the long via 330. Interconnect 402 comprises metal portions 404, 408, 412, and 416, vias 426, 430, 434, 436, 438, 440, 442, 446, 448, and 450, a cell interconnect 451, a sense connection 454, and an MTJ 452. Interconnect 402 is different from interconnect 304 only in that there is a via 430 between the first thick metal layer, metal portion 408, and the bit line, metal portion 412. Via 430 is used to provide a direct connection between the bit line, 412, and the upper conductor layers, 408 and 404. Referencing FIG. 3, the connection between bit line 314 and upper layer interconnects 312 and 308 exists through an alternate path through via 332, interconnect 318/316, and upward to 302.

Figure 5:
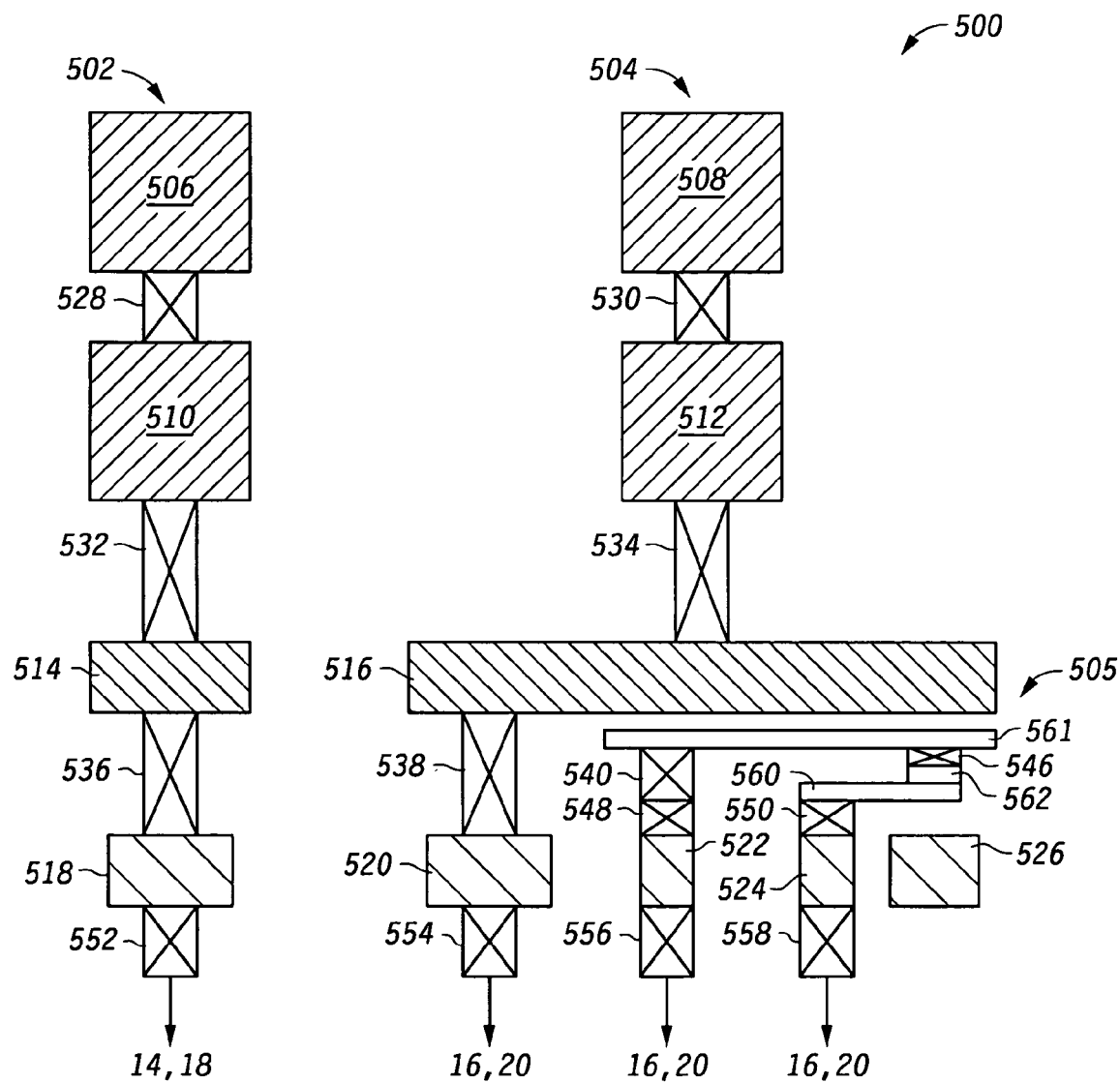
FIG. 5 is a cross section of an integrated circuit according to a fourth implementation of the integrated circuit of FIG. 1.

Shown in FIG. 5 is a semiconductor device 500 showing a fourth more detailed implementation of the device of FIG. 1. Device 500 comprises an interconnect 502 as a fourth detailed implementation of interconnect 22 of FIG. 1 and interconnect 504 as a fourth detailed implementation of interconnect 24 of FIG. 1. Interconnect 502 comprises metal portions 506, 510, 514, and 518 and vias 528, 532, 536, and 552. Vias 528, 532, and 536 interconnect metal portions 506, 510, 514, and 518, respectively. Via 552 connects metal portion 518 to interconnect 18 or front end 14. Metal portions 514 and 518 are the top two relatively thin interconnect layers. These layers would preferably be separated by a low k dielectric but they are separated by a bigger distance than normal so the need for low K is reduced. Interconnect 504 comprises metal portions 508, 512, 516, and 520, vias 530, 534, 538, 540, 546, 548, 550, 554, 556, and 558, a cell interconnect 561, a sense connection 5560, and an MTJ 562. The analogous elements are connected as described for FIG. 2 to form an MRAM cell 505. In this case, MRAM cell 505 is formed between the top two relatively thin layers of metal and under the top two relatively thick layers of metal. Metal portions 516 and 514 form one metal line that is in common with the logic and the MRAM cell and metal portions 518, 520, 522, 524, and 526 form a second metal line in common between logic and the MRAM cell. Due to the insertion of MRAM cell 505 between metal lines, these metal lines must be separated further which allows for use of lower temperature dielectrics which are more compatible with the materials used for MRAM cells.

Figure 6:
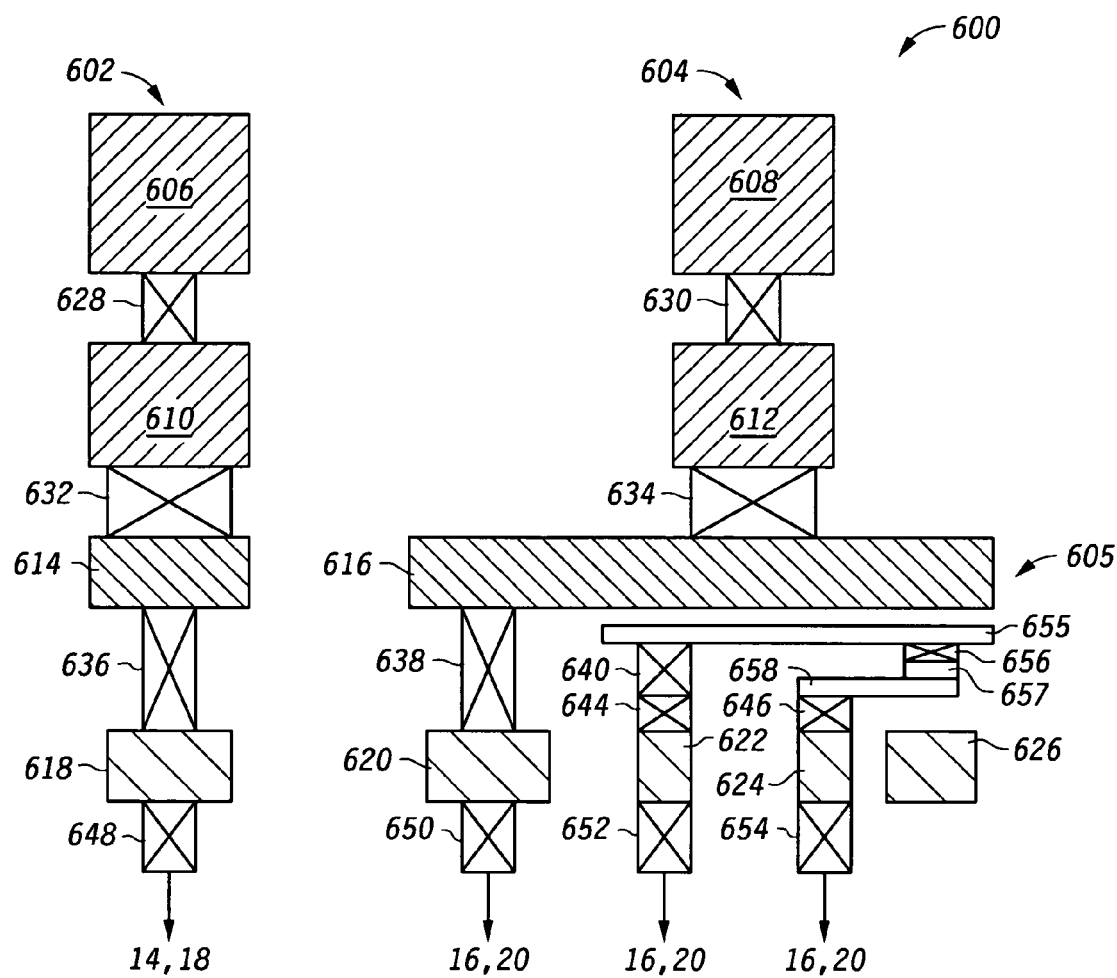
FIG. 6 is a cross section of an integrated circuit according to a fifth implementation of the integrated circuit of FIG. 1.

Shown in FIG. 6 is a semiconductor device 600 showing a fifth more detailed implementation of the device of FIG. 1. Device 600 comprises an interconnect 602 as a fourth detailed implementation of interconnect 22 of FIG. 1 and interconnect 604 as a fifth detailed implementation of interconnect 24 of FIG. 1. Interconnect 602 comprises a metal portion 606, 610, 614, and 618, and vias 628, 632, 614, 636, and 648. Vias 628, 632, and 636 interconnect metal portions 606, 610, 614, and 618, respectively. Via 648 connects metal portion 618 to either interconnect 18 or front end 14. Interconnect 604 comprises metal portion 608, 612, 616, and 620, vias 630, 634, 638, 640, 642, 644, 646, 650, 652, and 654, a cell interconnect 655, an MTJ 657, and a sense connection 658. Analogous elements are connected as in FIG. 2 to form an MRAM cell 605. Metal portions 616 and 614 form metal layer that is in common between logic and MRAM as do metal portions 618, 620, 622, 624, and 626. In this case, metal portions 612 and 614 are connected by an oversize via 632. The width of via 632 is able to be greater than the width of the vias such as via 628, because via 632 is connecting layers that do not have fine geometry requirements.

In the foregoing specification, the invention has been described with reference to specific embodiments. However, one of ordinary skill in the art appreciates that various modifications and changes can be made without departing from the scope of the present invention as set forth in the claims below. For example, the metal layers may be a composite of material some of which may not be metals. Doped silicon is often used as a conductor. The program lines were described as being orthogonal but they may be at some other angle with respect to each other. As another example, the non-MRAM circuit has been described as a logic circuit but it could also be another type such as an analog circuit. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device, comprising:
   a semiconductor substrate having a first portion for an MRAM and a second portion for a first circuit type, wherein the first circuit type is different than MRAM;
   first front end circuitry for the MRAM over the first portion in the substrate;
   second front end circuitry for the first circuit type in the second portion of the substrate;
   an MRAM cell over the first front end circuitry, wherein the MRAM cell uses a first metal layer for a first program line;
   a metal interconnect over the second front end circuitry, wherein the metal interconnect uses the first metal layer to provide interconnect for the first circuit type; and
   a third metal layer over the first and second metal layers and a fourth metal layer over the third metal layer, wherein the third and fourth metal layers are both thicker than the first and second metal layers;
   wherein the MRAM cell is characterized as using a second metal layer for a second program line and the metal interconnect is characterized as using the second metal layer to provide interconnect for the first type of circuitry.

2. The semiconductor device of claim 1, wherein the third and fourth metal layers have substantially the same thickness.

3. The semiconductor device of claim 2, wherein a portion of the first metal layer functions as a digit line.

4. The semiconductor device of claim 3, wherein a portion of the second metal line functions as a bit line.

5. The semiconductor device of claim 2, wherein the third and fourth layers are separated by a first distance and the second and third layers are separated by a second distance, wherein the second distance is greater than the first distance.

6. The semiconductor device of claim 2, wherein the third and fourth layers are separated by a first distance and the second and third layers are separated by a second distance, wherein the second distance is substantially equal to the first distance.

7. The semiconductor device of claim 1, wherein the fourth layer is thicker than the third layer.

8. The semiconductor device of claim 7, wherein the third and fourth metal layers are connected by vias of a first width and the third and second metal layers are connected by vias of a second width greater than the first width.

9. A semiconductor device, comprising:
   a semiconductor substrate having a first portion for an MRAM and a second portion for a first circuit type, wherein the first circuit type is different than MRAM;
   first front end circuitry for the MRAM over the first portion in the substrate;
   second front end circuitry for the first circuit type in the second portion of the substrate;
   an MRAM cell over the first front end circuitry, wherein the MRAM cell uses a first metal layer for a first program line;
   a metal interconnect over the second front end circuitry, wherein the metal interconnect uses the first metal layer to provide interconnect for the first circuit type; and
   a third metal layer having a first portion over the first portion of the substrate and a second portion over the second portion of the substrate, wherein the first portion of the third metal layer is immediately over the second metal layer and the second portion of the third metal layer is immediately over the second metal layer.

10. A semiconductor device, comprising:
    a semiconductor substrate having a first portion for an MRAM and a second portion for a first circuit type, wherein the first circuit type is different than MRAM;
    first front end circuitry for the MRAM over the first portion in the substrate;
    second front end circuitry for the first circuit type in the second portion of the substrate;
    an MRAM cell over the first front end circuitry, wherein the MRAM cell uses a first metal layer for a first program line;

a metal interconnect over the second front end circuitry, wherein the metal interconnect uses the first metal layer to provide interconnect for the first circuit type; and a third metal over the second metal layer, wherein the third metal layer has a first portion over the first portion of the substrate and a second portion over the second portion of the substrate, wherein the second portion is substantially coterminous with the second layer and is connected to the second layer by a plurality of vias.

11. The semiconductor device of claim 10, wherein the MRAM cell uses the second metal layer for a second program line.

12. A semiconductor device, comprising:

a semiconductor substrate having a first portion for an MRAM and a second portion for a circuit of a type different than MRAM;

a first metal layer having a first portion over the first portion of the substrate and a second portion over the second portion of the substrate, wherein the first portion of the first metal layer is used as a first program line for the MRAM and the second portion of the first metal line is used for interconnecting the circuit;

a second metal layer over the first metal layer having a first portion over the first portion of the substrate and a second portion over the seconds portion of the substrate, wherein the first portion of the second metal layer is used for a second program line of the MRAM and the second portion of the second metal layer is used for interconnecting the circuit; and a third metal layer having a first portion over the first portion of the substrate and a second portion over the second portion of the substrate, wherein the second portion of the third metal layer is connected to the second portion of the second layer by a first via having a first length; and the second portion of the second metal layer is connected to the second portion of the first metal layer by a second via having a second length greater than the first length.

13. The semiconductor device of claim 12, wherein the third metal layer is the last metal layer of the semiconductor device.

14. The semiconductor device of claim 12, wherein the second portions of the second and third metal layers are substantially coterminous.

15. The semiconductor device of claim 12, further comprising a fourth metal layer over the third metal layer having a first portion over the first portion of the substrate and a second portion over the second portion of the substrate.

16. The semiconductor device of claim 15, wherein the fourth metal layer has a thickness greater than that of the third metal layer.

17. The semiconductor device of claim 15, wherein the fourth metal layer is connected to the third metal layer by a via.

18. A semiconductor device, comprising:

a semiconductor substrate having a first portion for an MRAM and a second portion for a circuit of a type different than MRAM;

a first metal layer having a first portion over the first portion of the substrate and a second portion over the second portion of the substrate, wherein the first portion of the first metal layer is used as a first program line for the MRAM and the second portion of the first metal line is used for interconnecting the circuit;

a second metal layer over the first metal layer over the first portion of the substrate used for a second program line of the MRAM; and a third metal layer having a first portion over the first portion of the substrate and a second portion over the second portion of the substrate, wherein the first portion of the third metal layer is immediately over the second metal layer and the second portion of the third metal layer is immediately over the first metal layer.

19. The semiconductor device of claim 18, further comprising:

a first via connecting the first portion of the second metal layer to the first portion of the first metal layer, the first via having a first length; and a second via connecting the second portion of the third metal layer to the second portion of the first metal layer, the second via having a second length greater than the first length.

* * * * *